United States Patent
Wu

(10) Patent No.: US 10,283,028 B2
(45) Date of Patent: May 7, 2019

(54) ORGANIC ELECTROLUMINESCENT DISPLAY PANEL, AGING TESTING DEVICE AND METHOD, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventor: Xiaoping Wu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/550,676

(22) PCT Filed: Mar. 24, 2017

(86) PCT No.: PCT/CN2017/078051
§ 371 (c)(1),
(2) Date: Aug. 11, 2017

(87) PCT Pub. No.: WO2017/197979
PCT Pub. Date: Nov. 23, 2017

(65) Prior Publication Data
US 2018/0233074 A1    Aug. 16, 2018

(30) Foreign Application Priority Data
May 20, 2016 (CN) .......................... 2016 1 0342258

(51) Int. Cl.
*H01L 27/32*   (2006.01)
*G09G 3/00*    (2006.01)
(Continued)

(52) U.S. Cl.
CPC ............... *G09G 3/006* (2013.01); *G09G 3/00* (2013.01); *G09G 3/3208* (2013.01);
(Continued)

(58) Field of Classification Search
None
See application file for complete search history.

(56) References Cited

U.S. PATENT DOCUMENTS 7,639,034 B2 * 12/2009 Murase .................. G09G 3/006
                                                        324/760.01
9,535,473 B2 *  1/2017 Noorlag ..................... G06F 1/26
(Continued)

FOREIGN PATENT DOCUMENTS

CN    201051368 Y    4/2008
CN    102043104 A    5/2011
(Continued)

OTHER PUBLICATIONS

English translation of PCT International Search Report, Application No. PCT/CN2017/078051, dated Jun. 22, 2017, 2 pages.
(Continued)

*Primary Examiner* — Michael Lebentritt
(74) *Attorney, Agent, or Firm* — Armstrong Teasdale LLP

(57) ABSTRACT

Embodiments of the present disclosure provide an organic electroluminescent display panel, an aging testing device and method, and a display device. A signal generator can simultaneously drive a plurality of parallel organic electroluminescent display panels to ensure the high efficiency of the aging test. In addition, during the aging test, the electrical coupling between the normal organic electroluminescent display panel and the signal generator can be maintained, and the electric coupling between the abnormal organic electroluminescent display panel and the signal generator can be disconnected. Thus, it is possible to prevent the
(Continued)

abnormal organic electroluminescent display panel from affecting other normal organic electroluminescent display panels in parallel therewith, under the premise of ensuring the high efficiency of the aging test.

15 Claims, 6 Drawing Sheets

(51) Int. Cl.
    *G09G 3/3233*     (2016.01)
    *G09G 3/3291*     (2016.01)
    *G09G 3/3208*     (2016.01)

(52) U.S. Cl.
    CPC ......... *G09G 3/3233* (2013.01); *G09G 3/3291* (2013.01); *H01L 27/3262* (2013.01); *G09G 2300/0819* (2013.01); *G09G 2320/043* (2013.01)

(56) References Cited

U.S. PATENT DOCUMENTS

| | | | | |
|---|---|---|---|---|
| 2004/0252090 | A1* | 12/2004 | Hsu | G09G 3/006 345/87 |
| 2005/0088379 | A1* | 4/2005 | Tsuchida | G09G 3/3258 345/76 |
| 2007/0229109 | A1* | 10/2007 | Hasegawa | B62B 3/006 324/756.02 |
| 2008/0088550 | A1* | 4/2008 | Kim | H02M 3/155 345/82 |
| 2012/0287102 | A1* | 11/2012 | Toyomura | G09G 3/3233 345/211 |
| 2015/0090395 | A1* | 4/2015 | Lin | G06F 1/1692 156/239 |

FOREIGN PATENT DOCUMENTS

| | | |
|---|---|---|
| CN | 102831851 A | 12/2012 |
| CN | 104217671 A | 12/2014 |
| CN | 105304517 A | 2/2016 |
| CN | 105788501 A | 7/2016 |

OTHER PUBLICATIONS

PCT Written Opinion, Application No. PCT/CN2017/078051, dated Jun. 22, 2017, 6 pages.: with English translation of relevant part.
China First Office Action, Application No. 201610342258.9, dated Mar. 16, 2018, 14 pps.: with English translation.

\* cited by examiner

ORGANIC ELECTROLUMINESCENT DISPLAY PANEL, AGING TESTING DEVICE AND METHOD, AND DISPLAY DEVICE

CROSS REFERENCE TO RELATED APPLICATIONS

This patent application is a National Stage Entry of PCT/CN2017/078051 filed on Mar. 24, 2017, which claims the benefit and priority of Chinese Patent Application No. 201610342258.9 filed on May 20, 2016, the disclosures of which are incorporated herein by reference in their entirety as part of the present application.

BACKGROUND

Embodiments of the present disclosure relate to the technical field of display, and more particularly to an organic electroluminescent display panel, an aging testing device and method, and a display device.

In existing display panels, the organic electroluminescent display (OLED) panel has advantages of simple preparation process, low cost, high luminous efficiency, and being easy to form a flexible structure.

In the production of the existing OLED panel, the aging test is usually performed after a package process, to ensure the stability and reliability of the OLED panel. The aging test generally uses a signal generator to apply a preset voltage to the OLED panel for a preset duration.

In order to reduce the cost and improve the efficiency of the aging test, a signal generator can be used to drive a plurality of OLED panels simultaneously. The plurality of OLED panels are connected in parallel to the signal generator, for the aging test. During the test, if a certain OLED panel is abnormal, all the test results of this OLED panel and other OLED panels connected in parallel therewith are abnormal.

It is a technical problem urgently to be solved by those skilled in the art, how to prevent the abnormal OLED panel from affecting other normal OLED panels connected in parallel therewith, under the premise of ensuring the high efficiency of the aging test.

BRIEF DESCRIPTION

Embodiments of the present disclosure provide an organic electroluminescent display panel, an aging testing device and method, and a display device.

A first aspect of embodiments of the present disclosure provides an aging testing device for an organic electroluminescent display panel, including a signal generator and an electric coupling apparatus. The signal generator is configured to apply a signal required for testing to an organic electroluminescent display panel. The electric coupling apparatus is electrically coupled between the signal generator and the organic electroluminescent display panel. And the electric coupling apparatus is configured to maintain the electric coupling between the organic electroluminescent display panel and the signal generator when the organic electroluminescent display panel is normal, and disconnect the electric coupling between the organic electroluminescent display panel and the signal generator when the organic electroluminescent display panel is abnormal, during an aging test.

In embodiments of the present disclosure, the electrical coupling apparatus includes a plurality of switching apparatuses. Each of the plurality of switching apparatuses is electrically coupled between the signal generator and corresponding organic electroluminescent display panel. The switching apparatus is configured to disconnect the electric coupling when the corresponding organic electroluminescent display panel is abnormal.

In embodiments of the present disclosure, the signal generator includes a first signal terminal and a second signal terminal. The first signal terminal is electrically coupled to the organic electroluminescent display panel via the switching apparatus. The second signal terminal is electrically coupled to the organic electroluminescent display panel.

In embodiments of the present disclosure, the switching apparatus includes a thin film transistor. The signal generator further includes a third signal terminal. A control electrode of the thin film transistor is electrically coupled to the third signal terminal. A first electrode of the thin film transistor is electrically coupled to the first signal terminal. A second electrode of the thin film transistor is electrically coupled to the organic electroluminescent display panel.

A second aspect of embodiments of the present disclosure further provides an aging testing method for an organic electroluminescent display panel, using the aging testing device for the organic electroluminescent display panel described above. The method includes applying, by a signal generator, a preset voltage signal to each of a plurality of organic electroluminescent display panels via an electrical coupling apparatus for a first preset duration, determining whether each of the organic electroluminescent display panels is normal, and applying, by the signal generator, a preset voltage signal to one or more organic electroluminescent display panel, which is determined to be normal, via the electrical coupling apparatus for a second preset duration.

In embodiments of the present disclosure, a preset voltage signal is applied to the one or more organic electroluminescent display panel, which is determined to be normal, simultaneously for a second preset duration.

In embodiments of the present disclosure, determining whether each of the organic electroluminescent display panels is normal includes detecting whether a current on each of the organic electroluminescent display panels falls within a preset range.

In embodiments of the present disclosure, determining whether each of the organic electroluminescent display panels is normal includes taking a display image on each of the organic electroluminescent display panels and comparing the obtained image with a preset display image.

In an embodiment of the disclosure, the first preset duration is less than the second preset duration.

A third aspect of embodiments of the present disclosure further provides an organic electroluminescent display panel, being tested with the aging testing method described above.

A fourth aspect of embodiments of the present disclosure further provides a display device including an organic electroluminescent display panel described above.

According to the abovementioned organic electroluminescent display panel, the aging testing device and method, and the display device, provided in embodiments of the present disclosure, a signal generator can simultaneously drive a plurality of organic electroluminescent display panels, which are connected in parallel, to ensure the high efficiency of the aging test. In addition, during the aging test, the electrical coupling between a normal organic electroluminescent display panel and the signal generator can be maintained, and the electric coupling between an abnormal organic electroluminescent display panel and the signal generator may be disconnected. Thus it is possible to prevent the abnormal organic electroluminescent display panel from affecting other normal organic electroluminescent display panels connected in parallel, under the premise of ensuring the high efficiency of the aging test.

BRIEF DESCRIPTION OF THE DRAWINGS

In order to more clearly illustrate the technical solutions of the embodiments of the present disclosure, the drawings of the embodiments will be briefly described below, and it should be understood that the drawings described below are only a few of the embodiments of the present disclosure rather than limit the present disclosure, in which.

DETAILED DESCRIPTION

Hereinafter, specific embodiments of an organic electroluminescent display panel, an aging testing device and method, and a display device provided in the embodiments of the present disclosure will be described in detail with reference to the accompanying drawings. It is obvious that the described embodiments are merely part of the embodiments of the present disclosure, not all of the embodiments. All other embodiments obtained by those of ordinary skill in the art, based on embodiments of the present disclosure, without making creative work, are within the scope of the present disclosure.

Figure 1:
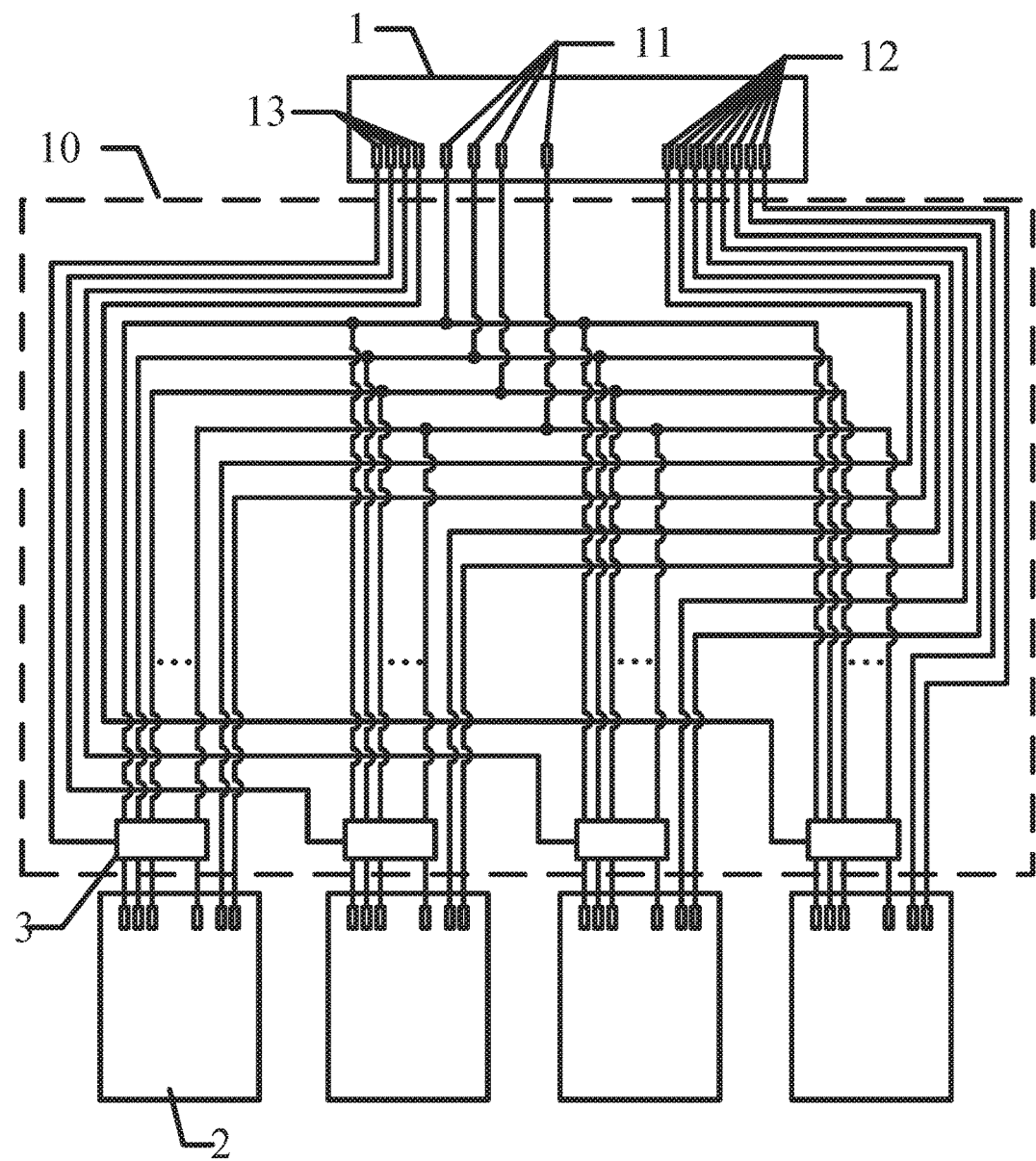
FIG. 1 is a schematic structural view of an aging testing device for an organic electroluminescent display panel provided in embodiments of the present disclosure.

FIG. 1 is a schematic structural view of an aging testing device for an organic electroluminescent display panel provided in embodiments of the present disclosure. As shown in FIG. 1, the aging testing device of the organic electroluminescence display panel 2 includes a signal generator 1 and an electrical coupling apparatus 10. The signal generator 1 is configured to apply a signal required for testing to an organic electroluminescent display panel. The electrical coupling apparatus 10 is electrically coupled between the signal generator and the organic electroluminescent display panel. The electrical coupling apparatus 10 is configured to maintain an electric coupling between the organic electroluminescent display panel 2 and the signal generator 1 when the organic electroluminescent display panel 2 is normal, and disconnect the electric coupling between the organic electroluminescent display panel 2 and the signal generator 1 when the organic electroluminescent display panel 2 is abnormal, during the aging test. According to a general understanding of those skilled in the art, "electric coupling" includes direct or indirect electrical connections.

As an example, the electrical coupling apparatus 10 may include a plurality of switching apparatuses 3. Each of the plurality of switching apparatuses 3 is electrically coupled between the signal generator 1 and the corresponding organic electroluminescent display panel 2. The switching apparatus 3 is configured to disconnect the electric coupling when the corresponding organic electroluminescent display panel 2 is abnormal.

As an example, the signal generator 1 may include a first signal terminal 11 and a second signal terminal 12. The first signal terminal 11 is electrically coupled to the organic electroluminescent display panel 2 via the switching apparatus 3. The second signal terminal 12 is electrically coupled to the organic electroluminescent display panel 2. In such a coupling manner, the first signal terminal 11 may be used to provide a timing signal or a power signal with small current value, and the second signal terminal 12 may be used to provide a power signal with large current value, for example, the power source of an organic electroluminescent component.

According to the above-described aging testing device provided in embodiments of the present disclosure, a signal generator can simultaneously drive a plurality of parallel organic electroluminescent display panels to ensure the high efficiency of the aging test. In addition, a plurality of switching apparatuses corresponding one-to-one to the respective organic electroluminescent display panels are added in the aging testing device, to electrically couple the signal generator to the corresponding organic electroluminescent display panel. Therefore, it is possible to firstly detect whether an organic electroluminescent display panel is abnormal, then use the switching apparatus to disconnect the electric coupling between the abnormal organic electroluminescent display panel and the signal generator, and then perform an aging test on the normal organic electroluminescent display panel. In this way, it is possible to prevent the abnormal organic electroluminescent display panel from affecting other normal organic electroluminescent display panels in parallel therewith, under the premise of ensuring the high efficiency of the aging test.

Figure 2:
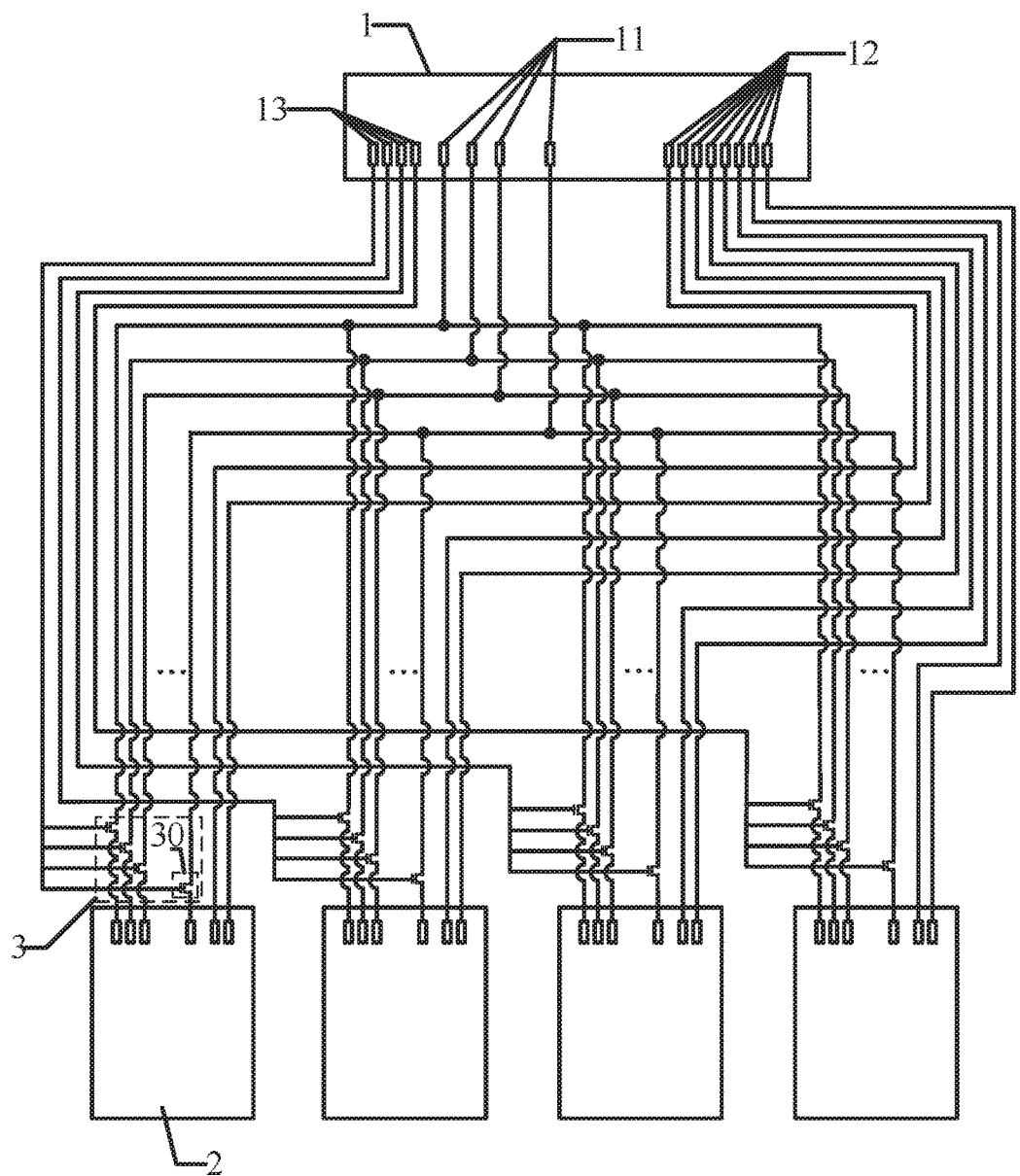
FIG. 2 is another schematic structural view of the aging testing device for the organic electroluminescent display panel provided in embodiments of the present disclosure.

FIG. 2 is another schematic structural view of the aging testing device for the organic electroluminescent display panel provided in embodiments of the present disclosure. As shown in FIG. 2, for example, the signal generator 1 may include a plurality of first signal terminals 11. FIG. 2 shows that four first signal terminals 11 are simultaneously connected to all organic electroluminescent display panels. Correspondingly, each switching apparatus 3 may include a plurality of thin film transistors (TFTs) 30 corresponding one-to-one to a plurality of first signal terminals 11. FIG. 2 shows the case of four thin film transistors 30. The signal generator 1 may further include a plurality of third signal terminals 13 corresponding one-to-one to a plurality of switching apparatus 3. Namely, the number of the third signal terminals 13 may correspond to the number of the organic electroluminescent display panels 2. Each of the third signal terminals 13 is electrically coupled to the control electrodes of a plurality of thin film transistors 30 in the corresponding switching apparatus 3. Thus, the third signal terminal 13 in the signal generator 1 can simultaneously turn on/off a plurality of thin film transistors 30 in the corresponding switching apparatus 3. In each switching apparatus 3, the first electrode of each of a plurality of thin film transistors 30 is electrically coupled to the corresponding first signal terminal 11, and the second electrode of each of a plurality of thin film transistors 30 is electrically coupled to the corresponding organic electroluminescent display panel 2.

It will be understood that in a thin film transistor, the control electrode may be the gate, and the first and second electrodes may respectively correspond to the source and drain. The thin film transistor has a small conduction resistance, and therefore does not affect the signal generator in driving the organic electroluminescent display panel. In addition, the thin film transistor is small in size, easy to produce, and conducive to reducing the size of the aging testing device and reducing costs. However, it should be understood, that in the above-mentioned aging testing device provided in the embodiments of the present disclosure, the structure of the switch is not limited to the thin film transistor shown in FIG. 2, but may be other types of switch structures with small resistance, and the present disclosure is not limited thereto.

Figure 3:
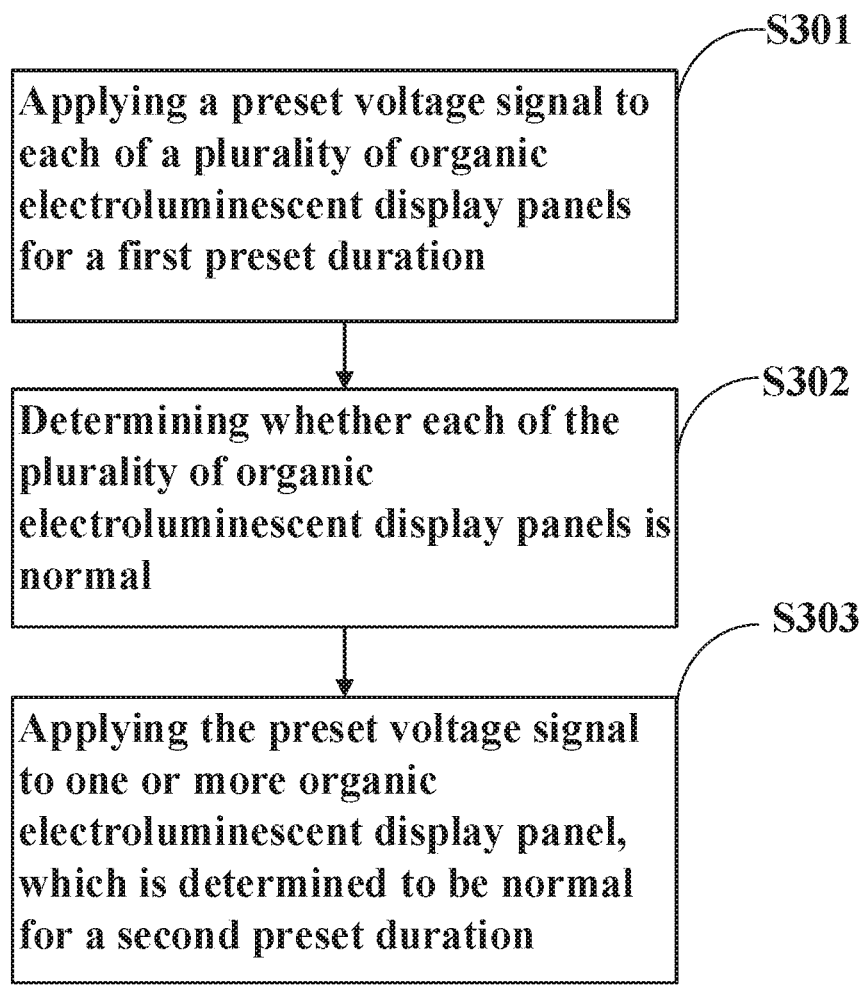
FIG. 3 is a first exemplary flow chart of an aging testing method provided in embodiments of the present disclosure.

FIG. 3 is a first exemplary flow chart of an aging testing method provided in embodiments of the present disclosure. As shown in FIG. 3, the aging testing method for the organic electroluminescent display panel includes the steps of: S301, applying a preset voltage signal to each of a plurality of organic electroluminescent display panels for a first preset duration, S302, determining whether each of the plurality of organic electroluminescent display panel is normal, and S303, applying a preset voltage signal to one or more organic electroluminescent display panel, which is determined to be normal, for a second preset duration.

In step S301, for example, the signal generator 1 shown in FIG. 1 may be used to apply a preset voltage signal to each of a plurality of organic electroluminescent display panels 2 via the electrical coupling apparatus 10 for a first preset duration. In step S302, after the organic electroluminescent display panels 2 are driven, the data acquired by various sensors can be used to determine their operating states. As an example, the detection of the organic electroluminescent display panels 2 may be performed in sequence. Namely, the voltage signal may be applied to the first organic electroluminescent display panel to determine whether it is normal. If this organic electroluminescent display panel 2 is abnormal, this organic electroluminescent display panel 2 is disconnected from all the first signal terminals. Then, a voltage signal is applied to the next organic electroluminescent display panel 2. This process continues until the determinations of the operating states of all organic electroluminescence display panels 2 are completed. The manner in which one organic electroluminescent display panel 2 is detected each time can reduce the requirements for the number of sensors. As another example, it is also possible to simultaneously detect the operating states of the plurality of organic electroluminescent display panels 2 after applying a voltage signal to all the organic electroluminescent display panels 2. If there is an abnormal organic electroluminescent display panel, the abnormal organic electroluminescent display panel is disconnected from all the first signal terminals. The manner of simultaneously detecting a plurality of organic electroluminescent display panels 2 can save time. In step S303, the signal generator 1 is used to perform an aging test on the normal organic electroluminescent display panel 2 via the electrical coupling apparatus 10.

According to the above-described method provided in embodiments of the present embodiment, each organic electroluminescent display panel 2 can be firstly detected using the signal generator 1 to determine whether it is normal. After an abnormal organic electroluminescent display panel 2 is determined, the abnormal organic electroluminescent display panel 2 is disconnected from the signal generator 1, and the normal organic electroluminescent display panel 2 goes to an aging test. In this way, it is possible to prevent the abnormal organic electroluminescent display panel 2 from affecting the other normal organic electroluminescent display panels 2 in parallel therewith, under the premise of ensuring the high efficiency of the aging test.

As an example, in step S303, a voltage signal is simultaneously applied to all normal organic electroluminescent display panels for a second preset duration. In this way, it is possible to maximize the efficiency of the aging test. Of course, in the above-described method provided in embodiments of the present disclosure, it is also possible to divide the normal organic electroluminescent display panels into a plurality of groups. A plurality of switches corresponding to each group of organic electroluminescent display panels are turned on respectively, and a voltage signal is applied to each group of organic electroluminescent display panels for a second preset duration respectively. The method of testing per group can reduce the requirements for the drive capability of the signal generator while ensuring efficiency.

As an example, the first preset duration can be controlled in the range of is 1s to 10s, which can not only ensure the high accuracy of detection of each organic electroluminescent display panel but also improve the efficiency of the aging test. As an example, the second preset duration can be controlled in the range of 20 min to 30 min to ensure good results of the aging test. The first preset duration is set to be smaller than the second preset duration, and the efficiency of the aging test can be improved.

Figure 4:
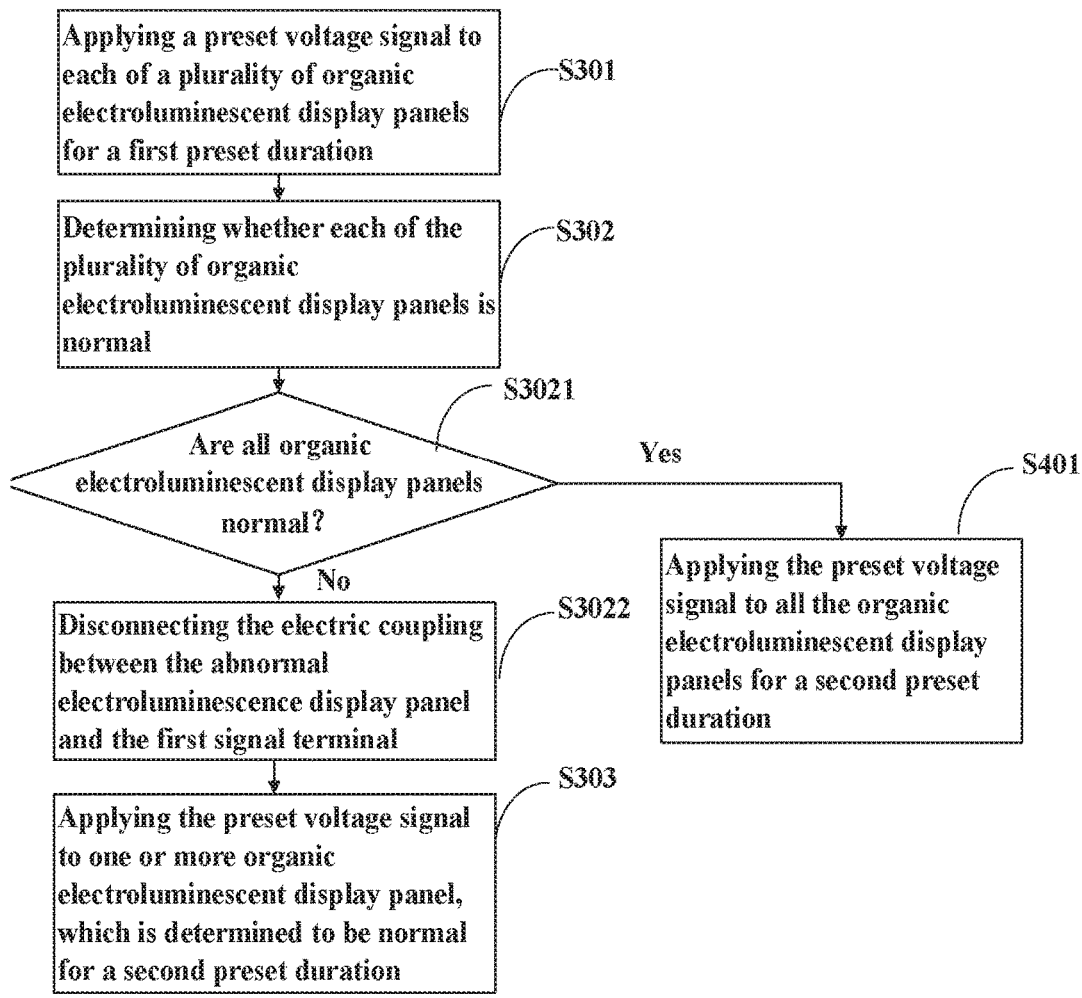
FIG. 4 is a second exemplary flow chart of an aging testing method provided in embodiments of the present disclosure.

FIG. 4 is a second exemplary flow chart of an aging testing method provided in embodiments of the present disclosure. As shown in FIG. 4, after step S302 in which it is determined whether or not each organic electroluminescent display panel is normal, the process proceeds to step S3021 to determine whether all the organic electroluminescent display panels 2 are normal. If all of them are normal, step S401 is performed to simultaneously apply a voltage signal to each organic electroluminescent display panel for a second preset duration. If there is an abnormal organic electroluminescent display panel 2, the process proceeds to step S3022 to disconnect the electric coupling between the abnormal electroluminescent display panel 2 and the signal generator 1 (for example, the first signal terminal 11). Then, the process proceeds to step S303 to apply a preset voltage signal to the normal organic electroluminescence display panel for the second preset duration.

As an example, in the case of using the aging testing device shown in FIG. 1 or FIG. 2, after step S3021 is performed, the abnormal organic electroluminescent display panel 2 may also remain electrically coupled to the signal generator 1. By step S3022, it is ensured that the electric coupling between the abnormal electroluminescence display panel 2 and the first signal terminal 11 of the signal generator 1 is disconnected to prevent the influence on the normal organic electroluminescent display panel 2.

Figure 5:
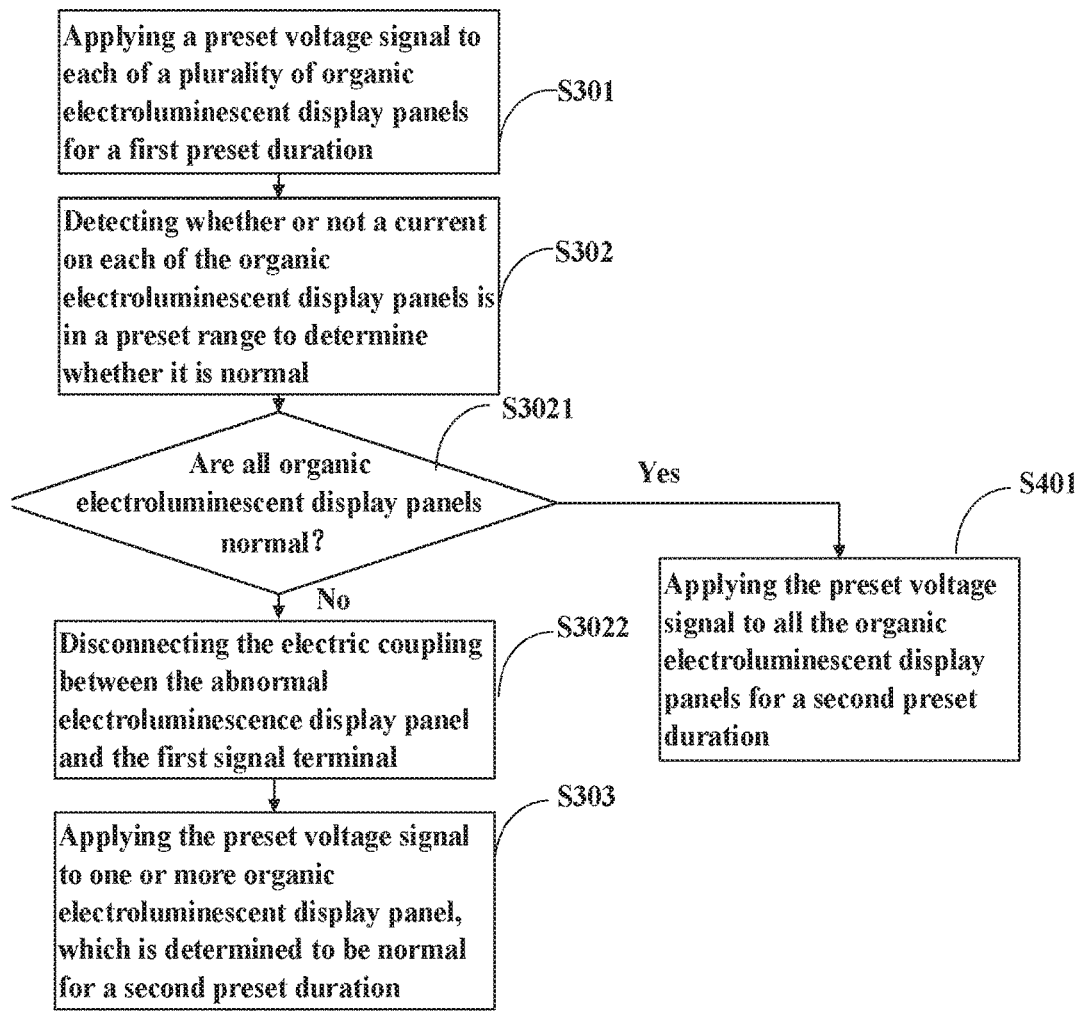
FIG. 5 is a third exemplary flow chart of an aging testing method provided in embodiments of the present disclosure.

FIG. 5 is a third exemplary flow chart of an aging testing method provided in embodiments of the present disclosure. A more detailed description of step S302 in FIG. 3 and FIG. 4 is shown in FIG. 5. As shown in FIG. 5, as an example, in step S302, it is detected whether a current on each organic electroluminescence display panel 2 falls within a preset range, to determine whether or not it is normal. For example, if the current is too small, the circuit inside the organic electroluminescent display panel 2 may be open, and if the current is too large, the circuit inside the organic electroluminescent display panel 2 may be shorted. By detecting the current value, it is possible to quickly and easily determine whether or not the organic electroluminescent display panel 2 is normal.

Figure 6:
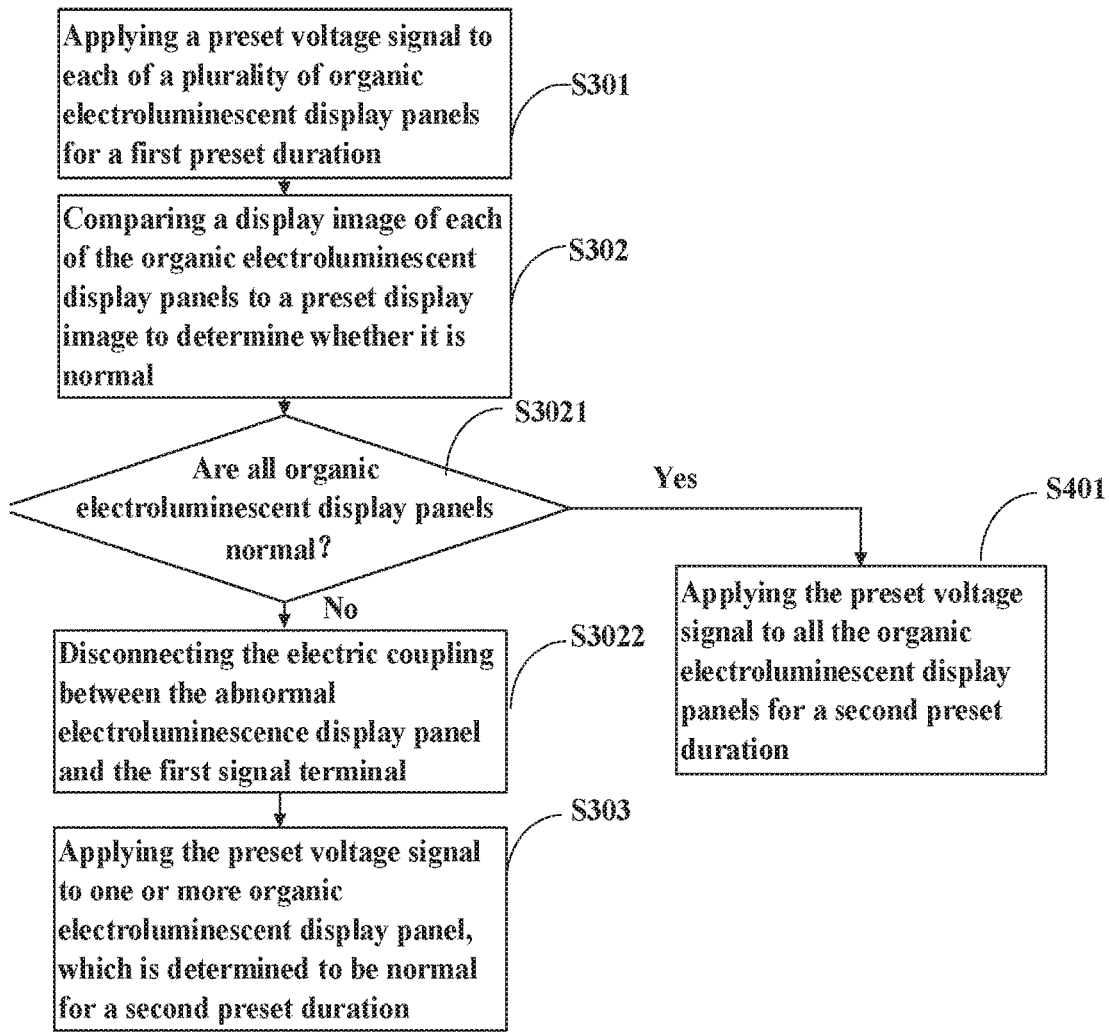
FIG. 6 is a fourth exemplary flow chart of an aging testing method provided in embodiments of the present disclosure.

FIG. 6 is a fourth exemplary flow chart of an aging testing method provided in embodiments of the present disclosure. As another example, FIG. 6 differs from FIG. 5 in step S302. A display image of each organic electroluminescence display panel is obtained. The obtained image is compared to a preset display image to determine whether or not each electroluminescent display panel 2 is normal. With the display image, more information can be obtained to more accurately determine the state of the organic electroluminescent display panel 2. The comparison between the display images can be done directly by the tester or by an image processing device.

In step S302, the manner of determining whether or not each organic electroluminescent display panel is normal is not limited to the determination manner shown in FIGS. 5 and 6, and may also be other similar determination manners, and the present disclosure is not limited thereto.

Embodiments of the present disclosure further provide an organic electroluminescent display panel, being tested with the aging testing method provided in embodiments of the present disclosure. The implementation of the organic electroluminescent display panel can refer to the embodiments of the above-described aging testing method, which will not be repeated herein.

Embodiments of the present disclosure further provide a display device including the above-described organic electroluminescent display panel provided in embodiments of the present disclosure. The display device may be a mobile phone, a tablet computer, a television set, a display, a notebook computer, a digital photo frame, a navigator, or any product or component having a display function. The implementation of the display device can refer to the embodiments of the above-described organic electroluminescent display panel, which will not be repeated herein.

In an organic electroluminescent display panel, an aging testing device and method, and a display device provided in embodiments of the present disclosure, a signal generator can simultaneously drive a plurality of parallel organic electroluminescent display panels to ensure the high efficiency of the aging test. In addition, a plurality of switching apparatus corresponding one-to-one to the each organic electroluminescent display panel are added in the aging testing device to electrically couple the signal generator and the corresponding organic electroluminescent display panel. Therefore, it is possible to firstly detect whether or not the organic electroluminescent display panel is abnormal, then use the switch to disconnect the electric coupling between the abnormal organic electroluminescent display panel and the signal generator, and then, performing an aging test on the normal organic electroluminescent display panel. In this way, it is possible to prevent an abnormal organic electroluminescent display panel from affecting the other organic electroluminescent display panels in parallel therewith under the premise of ensuring the high efficiency of the aging test.

Obviously, those skilled in the art may make various changes and modifications to the embodiments of the present disclosure without departing from the spirit and scope of the present disclosure. In this manner, the present disclosure is intended to embrace such modifications and variations if these modifications and variations of the embodiments of the present disclosure are within the scope of the appended claims of the present disclosure and the equivalents thereof.

What is claimed is:

1. An aging testing device for an organic electroluminescent display panel, the aging testing device comprising:

a signal generator configured to apply a signal required for testing to an organic electroluminescent display panel; and an electric coupling apparatus electrically coupled between the signal generator and the organic electroluminescent display panel, and configured to, during an aging test, i) maintain an electric coupling between the organic electroluminescent display panel and the signal generator when the organic electroluminescent display panel is normal, and ii) disconnect the electric coupling between the organic electroluminescent display panel and the signal generator when the organic electroluminescent display panel is abnormal, wherein the electrical coupling apparatus comprises a plurality of switching apparatuses, wherein each of the plurality of switching apparatuses is electrically coupled between the signal generator and a corresponding organic electroluminescent display panel, and wherein each of the plurality of switching apparatuses is configured to disconnect the respective electrical coupling when the corresponding organic electroluminescent display panel is abnormal, wherein the signal generator comprises a first signal terminal and a second signal terminal, wherein the first signal terminal is electrically coupled to the organic electroluminescent display panel via a first switching apparatus of the plurality of switching apparatuses, and wherein the second signal terminal is electrically coupled to the organic electroluminescent display panel, wherein the first switching apparatus comprises a thin film transistor, wherein the signal generator further comprises a third signal terminal, and wherein a control electrode of the thin film transistor is electrically coupled to the third signal terminal, wherein a first electrode of the thin film transistor is electrically coupled to the first signal terminal, and wherein a second electrode of the thin film transistor is electrically coupled to the organic electroluminescent display panel.

2. An aging testing method for an organic electroluminescent display panel using an aging testing device, wherein the method comprises:

applying, by a signal generator, a preset voltage signal to each of a plurality of organic electroluminescent display panels via an electrical coupling apparatus for a first preset duration;

determining whether each of the plurality of organic electroluminescent display panels is normal; and applying, by the signal generator, the preset voltage signal to at least one organic electroluminescent display panel determined to be normal via the electrical coupling apparatus for a second preset duration.

3. The aging testing method for the organic electroluminescent display panel according to claim 2, wherein the preset voltage signal is applied to the at least one organic electroluminescent display panel determined to be normal simultaneously for the second preset duration.

4. The aging testing method for the organic electroluminescent display panel according to claim 2, wherein determining whether each of the plurality of organic electroluminescent display panels is normal comprises detecting whether a current on each of the plurality of organic electroluminescent display panels falls within a preset range.

5. The aging testing method for the organic electroluminescent display panel according to claim 2, wherein determining whether each of the plurality of organic electroluminescent display panels is normal comprises:
obtaining a display image on each of the plurality of organic electroluminescent display panels; and
comparing the obtained display image with a preset display image.

6. The aging testing method for the organic electroluminescent display panel according to claim 2, wherein the first preset duration is less than the second preset duration.

7. An organic electroluminescent display panel tested with the aging testing method for the organic electroluminescent display panel according to claim 2.

8. A display device, comprising an organic electroluminescent display panel according to claim 7.

9. The aging testing method according to claim 3, wherein the first preset duration is less than the second preset duration.

10. The aging testing method according to claim 4, wherein the first preset duration is less than the second preset duration.

11. The aging testing method according to claim 5, wherein the first preset duration is less than the second preset duration.

12. The organic electroluminescent display panel according to claim 7, wherein the preset voltage signal is applied to the at least one organic electroluminescent display panel determined to be normal simultaneously for the second preset duration.

13. The organic electroluminescent display panel according to claim 7, wherein determining whether each of the plurality of organic electroluminescent display panels is normal comprises detecting whether a current on each of the plurality of organic electroluminescent display panels falls within a preset range.

14. The organic electroluminescent display panel according to claim 7, wherein determining whether each of the plurality of organic electroluminescent display panels is normal comprises:
obtaining a display image on each of the plurality of organic electroluminescent display panels; and
comparing the obtained display image with a preset display image.

15. The organic electroluminescent display panel according to claim 7, wherein the first preset duration is less than the second preset duration.

* * * * *

UNITED STATES PATENT AND TRADEMARK OFFICE
CERTIFICATE OF CORRECTION

PATENT NO. : 10,283,028 B2
APPLICATION NO. : 15/550676
DATED : May 7, 2019
INVENTOR(S) : Xiaoping Wu Page 1 of 1

It is certified that error appears in the above-identified patent and that said Letters Patent is hereby corrected as shown below:

In the Specification

Column 6, Line 19, delete "in the range of is 1s" and insert therefor -- in the range of 1s --.

Signed and Sealed this
Thirteenth Day of August, 2019

Andrei Iancu
*Director of the United States Patent and Trademark Office*